United States Patent
Efland et al.

(10) Patent No.: US 6,236,098 B1
(45) Date of Patent: *May 22, 2001

(54) HEAT SPREADER

(75) Inventors: Taylor R. Efland, Richardson; R. Travis Summerlin, Parker; Joseph A. Devore, Dallas, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/061,452

(22) Filed: Apr. 16, 1998

Related U.S. Application Data

(60) Provisional application No. 60/045,235, filed on Apr. 16, 1997.

(51) Int. Cl.$^7$ .................................................. H01L 31/058
(52) U.S. Cl. .................. 257/467; 257/468; 257/470; 257/712; 257/713; 257/720; 257/762; 257/766; 257/767; 257/684; 257/796; 257/706; 257/707
(58) Field of Search ..................................... 257/467, 468, 257/470, 712, 713, 720, 762, 766, 767, 684, 796, 706, 707

(56) References Cited

U.S. PATENT DOCUMENTS

| | | | |
|---|---|---|---|
| 5,468,984 | * 11/1995 | Elfand et al. | 257/356 |
| 5,691,567 | * 11/1997 | Lo et al. | 257/675 |
| 5,726,481 | * 3/1998 | Moody | 257/467 |

OTHER PUBLICATIONS

08/711,138 FWC of 08/333,174, Multiple Transistor Integrated Circuit with Thick Copper Interconnect, Originally filed Nov. 2, 1994, pending.*
08/903,970 FWC of 07/850,601, Method for Ballasting and Busing Over Active Device Area Using a Multi–Level Conductor Process, originally filed Mar. 13, 1992, pending.*
08/864,386, Plated Copper and Plated Copper with Plated Nickel Cap Interconnect Metallization on a Silicon Integrated Circuit, filed May 28, 1997, pending.*

* cited by examiner

Primary Examiner—Carl Whitehead, Jr.
Assistant Examiner—Matthew E. Warren
(74) Attorney, Agent, or Firm—Wade James Brady, III; Frederick J. Telecky, Jr.

(57) ABSTRACT

An integrated circuit chip (10, 50, 100) may comprise an integrated circuit (14, 54, 108, 110, 112) formed in a semiconductor layer (12, 52, 102). A thermal contact (16, 56, 116) may be formed at a high temperature region of the integrated circuit (14, 54, 108, 110, 112). A thick plated metal layer (40, 80, 140) may be generally isolated from the integrated circuit (14, 54, 108, 110, 112). The thick plated metal layer (40, 80, 140) may include a base (42, 82, 142) and an exposed surface (44, 84, 144) opposite the base (42, 82, 142). The base (42, 82, 142) may be coupled to the thermal contact (16, 56, 116) to receive thermal energy of the high temperature region. The exposed surface (44, 84, 144) may dissipate thermal energy received by the thick plated metal layer (40, 80, 140).

10 Claims, 3 Drawing Sheets

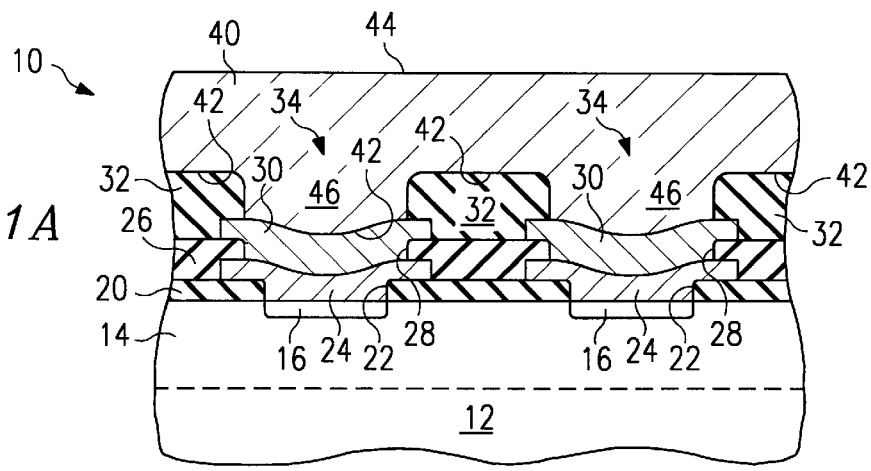
FIG. 1A
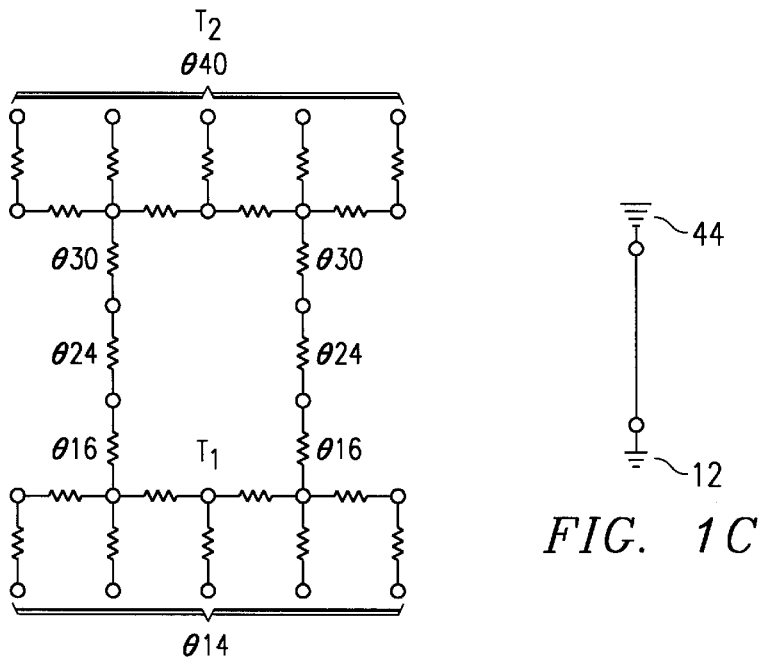
FIG. 1B
FIG. 1C
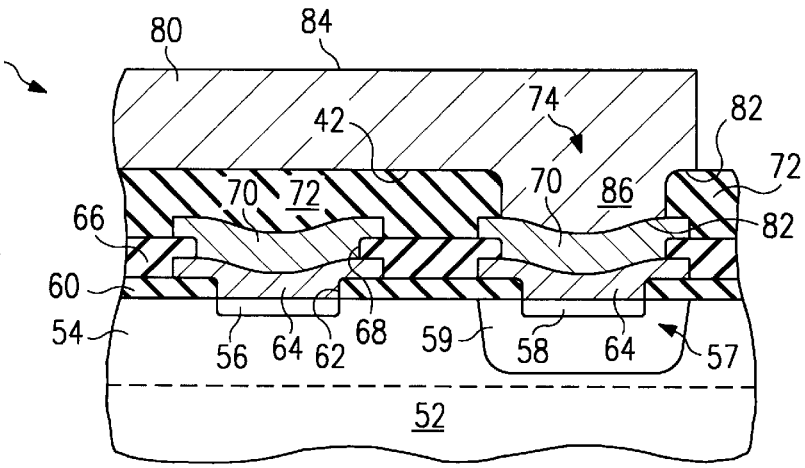
FIG. 3A

HEAT SPREADER

This application claims priority under 35 USC § 119(e)(1) of provisional application Ser. No. 60/045,235 filed Apr. 16, 1997.

RELATED APPLICATIONS

This application is related to copending U.S. Pat. application Ser. No. 09/060,147, entitled "IMPROVED THERMAL SENSING SYSTEM FOR INTEGRATED CIRCUIT AND METHOD" (Attorney's Docket TI-21400).

TECHNICAL FIELD OF THE INVENTION

This invention relates generally to the field of semiconductor devices, and more particularly to an improved heat spreader for an integrated circuit chip and to a method of forming the same.

BACKGROUND OF THE INVENTION

Packaged integrated circuit devices generally contain heat sinks or spreaders. The heat sink may be in the package and include a top layer of plated metal integral to the integrated circuit for efficient dissipation of thermal energy. In general, thermal energy is a function of power generated by an integrated circuit. Accordingly, dissipation of thermal energy is especially important in power integrated circuits, microprocessors, large digital signal processors, large area high component count integrated circuits, and the like.

To dissipate thermal energy an integrated circuit package may include a large heat sink in the form of a copper slug as an integral part of the metal lead frame to which the integrated circuit is mounted. The back of the integrated circuit may be mounted to the metal slug with either epoxy or solder. Thermal energy is transferred from the integrated circuit in the semiconductor material of the chip and then to the metal slug. A surface mounted heat sink and fan may also be used to dissipate thermal energy. Using this scheme, thermal energy is transferred from the semiconductor material up through metal and dielectric layers and ultimately through the plastic packaging to the surface mounted heat sink. A problem with these methods is that they generally require integrated circuits to operate at a relatively high temperature. Such temperatures can significantly degrade performance of the integrated circuits.

SUMMARY OF THE INVENTION

Accordingly, a need has arisen in the art for an improved heat spreader. The present invention provides a heat spreader for localized high temperature regions of an integrated circuit that substantially eliminates or reduces the disadvantages and problems associated with prior heat sinks or spreaders.

In accordance with the present invention, an integrated circuit chip may comprise an integrated circuit formed in a Semiconductor layer. A thermal contact may be formed at a high temperature region of the integrated circuit. A thick plated metal layer may be generally isolated from the integrated circuit. The thick plated metal layer may comprise a base and an exposed surface opposite the base. The base may be coupled to the thermal contact to conduct thermal energy from the high temperature region. The exposed surface may dissipate thermal energy received by the thick plated metal layer.

In accordance with another aspect of the present invention, the integrated circuit chip may comprise a semiconductor layer disposed on an insulation layer and further laterally isolated by dielectrics. In this aspect, the semiconductor and insulation layers may form an SOI system with the semiconductor layer thermally isolated from the bottom and sides by the dielectric layers. An integrated circuit may be formed in the semiconductor layer. A thick plated metal layer may be generally isolated from the semiconductor layer. The thick plated metal layer may comprise a base and an exposed surface opposite the base. In this embodiment, the base may be coupled to the semiconductor layer to receive thermal energy of the integrated circuit. The exposed surface may dissipate thermal energy received by the thick plated metal layer.

Important technical advantages of the present invention include providing a heat spreader capable of selective and localized heat extraction. In particular, low thermal impedance metal paths may extend from an exposed surface of a thick plated metal layer down to a semiconductor layer. Accordingly, heat generated by the integrated circuit may be efficiently transferred to the exposed sur ace and dissipated.

Another technical advantage of the present invention includes providing a heat spreader that can be used as an integral part of the integrated circuit package. In particular, the thick plated metal layer may be protectively capped and exposed from the package for increased thermal dissipation. Accordingly, operating temperatures of a packaged integrated circuit chip may be reduced and operating efficiency thereby increased.

Still another technical advantage of the present invention includes providing thermal pathways that may be used as active electrical leads. In particular, the thick plated metal layer may be connected to localized ground points to provide a ground plane above active lead circuitry. Additionally, the thick plated metal layer may be coupled to a thermal sensor circuit.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like referenced numerals represent like parts, in which:

FIG. 1A–C schematically illustrate a cross-sectional diagram, a thermal circuit, and an electrical circuit of an integrated circuit chip including a heat spreader in accordance with one embodiment of the present invention;

FIGS. 3A–C schematically illustrate a cross-sectional diagram, a thermal circuit, and an electrical circuit of an integrated circuit chip including a heat spreader coupled to a thermal sensor circuit in accordance with another embodiment of the present invention.

DETAILED DESCRIPTION OF THE INVENTION

Figure 2:
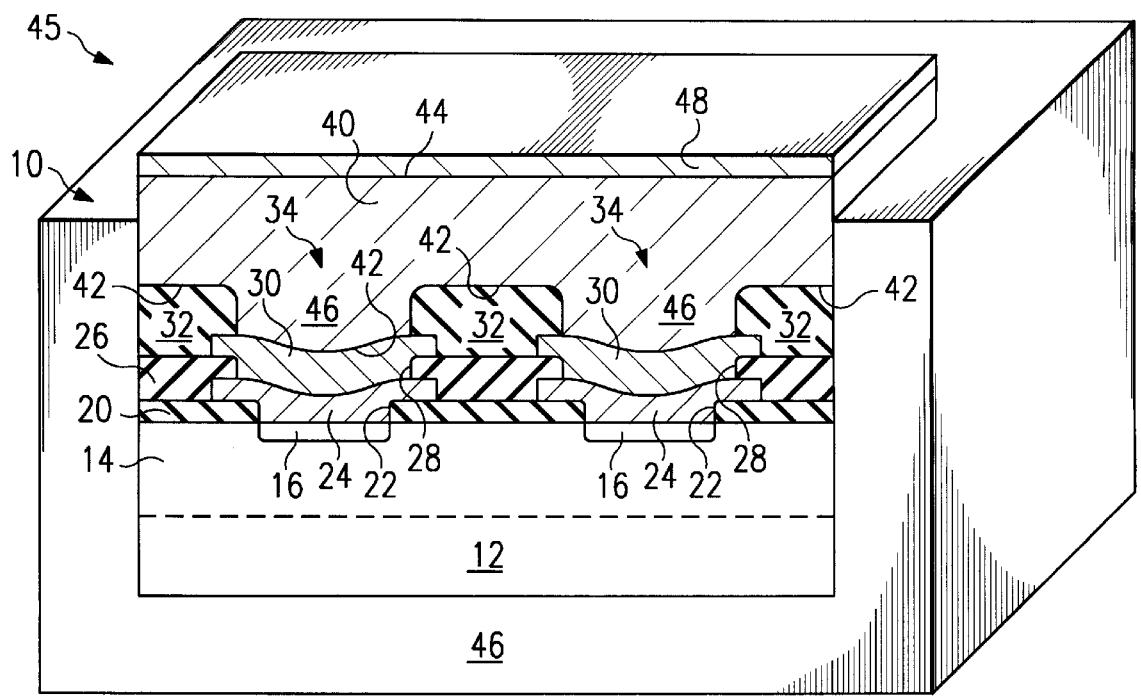
FIG. 2 is a cross-sectional diagram of the integrated circuit chip of FIG. 1 packaged in accordance with one embodiment of the present invention.

The preferred embodiments of the present invention and its advantages are best understood by referring now in more detail to FIGS. 1–4 of the drawings, in which like numerals refer to like parts throughout the several views. FIGS. 1–4 illustrate an integrated circuit chip having a thick plated metal layer that provides a low thermal impedance path for heat extraction and spreading. As described in more detail below, the thick plated metal layer may provide localized heat extraction, ground plane, and thermal sensing functions.

FIG. 1A–C schematically illustrate a cross-sectional diagram, a thermal circuit, and an electrical circuit of an integrated circuit chip 10 in accordance with one embodiment of the present invention. Referring to FIG. 1A, the integrated circuit chip 10 may comprise a semiconductor layer 12. The semiconductor layer 12 may be a substrate such as a wafer. It will be understood that the semiconductor layer 12 may also be a layer of semiconductor material formed on a substrate. For example, the semiconductor layer 12 may be an epitaxial layer grown on a wafer.

An integrated circuit 14 may be formed in the semiconductor layer 12. The integrated circuit 14 may include one or more thermal contacts 16. In one embodiment, the thermal contacts 16 may each comprise a segment of the semiconductor layer 12 and be over non-ohmic material or active circuitry. In this embodiment, the thermal contacts 16 may be electrically isolated from the integrated circuit 14. In another embodiment, the thermal contacts 16 may comprise localized ground points of the integrated circuit 14.

The thermal contacts 16 may be disposed at high temperature regions of the integrated circuit 14. For most applications, a good range of operation is between –50 and 150 degrees Celsius. High temperature regions may be regions where generated or collected heat of the integrated circuit 14 cannot be adequately dissipated through the semiconductor layer 12. High temperature regions often exist in power integrated circuits, microprocessors, large digital signal processors, large area high component count integrated circuits, and the like. High temperature regions can significantly degrade the performance of the integrated circuit 14. In one embodiment, the high temperature regions may have a temperature in excess of 150 degrees Celsius. It will be understood that the high temperature regions may have a lower temperature within the scope of the present invention.

A dielectric layer 20 may be formed on the integrated circuit 14 to generally isolate the integrated circuit 14 from further integrated circuit processing. In one embodiment, the dielectric layer 20 may comprise silicon dioxide thermally grown on the integrated circuit 14 in accordance with conventional integrated circuit processing. It will be understood that the dielectric layer 20 may comprise other nonconductive materials such as nitrides or the like.

Vias 22 may be formed in the dielectric layer 20 to expose the thermal contacts 16. The vias 22 may be formed by pattern and etching the dielectric layer 20 using conventional integrated circuit processing techniques. As described in more detail below, the vias 22 allow heat to be dissipated through the dielectric layer 20.

Metal interconnects 24 may be coupled to the thermal contacts 16 through the vias 22 in the dielectric layer 20. In one embodiment, the metal interconnects 24 may directly contact the thermal contacts 16. In this embodiment, the metal interconnects 24 may be formed by pattern and etching a metal layer deposited on the dielectric layer 20 and the thermal contacts 16. The pattern and etching may be in accordance with conventional integrated circuit processing.

A second dielectric layer 26 may be deposited on the dielectric layer 20 and the metal interconnects 24 to generally isolate those layers from further integrated circuit processing. In one embodiment, the second dielectric layer 26 may comprise silicon dioxide thermally grown on the dielectric layer 20 and the metal interconnects 24 in accordance with conventional integrated circuit processing. As previously described in connection with the dielectric layer 20, the second dielectric layer 26 may comprise other nonconductive materials such as nitride and the like.

Vias 28 may be formed in the second dielectric layer 26 to expose the metal interconnects 24. The vias 28 may be formed by pattern and etching the second dielectric layer 26 using conventional integrated circuit processing techniques. As described in more detail below, the vias 28 allow heat to be dissipated through the second dielectric layer 26.

Second metal interconnects 30 may be coupled to the metal interconnects 24 through the vias 28 in the second dielectric layer 26. In one embodiment, the second metal interconnects 30 may directly contact the underlying metal interconnects 24. In this embodiment, the second metal interconnects 30 may be formed by pattern and etching a second metal layer deposited on the second dielectric layer 26 and the metal interconnects 24. The pattern and etching may be in accordance with conventional integrated circuit processing.

As described above, the integrated circuit chip 10 of FIG. 1A may comprise two sets of metal interconnects and associated dielectric layers. The dielectric layers may act as thermal insulating barriers protecting other circuitry from heating effects. It will be understood that the integrated circuit chip 10 may comprise fewer or more sets of metal interconnects and dielectric layers within the scope of the present invention. It will be further understood that the vias may be otherwise disposed within the scope of the present invention. For example, the vias may be staggered, or offset, with respect to each other and the contacts to provide increased thermal ballasting. In this embodiment, the contacts may be extended to contact one another through the staggered vias.

A passivation overcoat 32 may be formed on the second dielectric layer 26 and the second interconnects 30. The passivation overcoat 32 may isolate the underlying layers generally from subsequent integrated circuit processing. Additionally, the passivation overcoat 32 may act as a thermal insulating barrier protecting other circuitry from heat spreading effects of the heat spreader.

In one embodiment, the passivation overcoat 32 may comprise nitride deposited onto the second dielectric layer 26 and the second metal interconnects 30. It will be understood that the passivation overcoat 32 may comprise other nonconductive materials within the scope of the present invention. For example, the passivation overcoat 32 may comprise oxy-nitride.

Vias 34 may be formed in the passivation overcoat 32 to expose the second metal interconnects 30. The vias 34 may be formed by pattern and etching the passivation overcoat 32 using conventional integrated circuit processing techniques. As described in more detail below, the vias 34 allow heat to be dissipated through the passivation overcoat 32.

A thick plated metal layer 40 may be formed on the passivation overcoat 32 and the second metal interconnects 30. The thick plated metal layer 40 may comprise a base 42 coupled to the thermal contacts 16 and an exposed surface 44 opposite the base 42. The exposed surface 44 may be on top and around the base 42. The surface 44 of the thick plated metal layer 40 is exposed in that it is not covered by the integrated circuit chip 10. As described in more detail below, the exposed surface 44 may be capped or otherwise covered within the scope of the present invention encapsulated with the integrated circuit chip 10.

For the embodiment of FIG. 1A, the base 42 may include thick plated projections 46 contacting the second metal interconnects 30. In this embodiment, the thick plated metal layer 40 is thermally coupled to the thermal contacts 16 through the projections 46, second metal interconnects 30 and metal interconnect 24. As described in more detail below in connection with FIG. 1B, the thick plated projections 46 and the metal interconnects 24 and 30 form a low thermal impedance path from the thermal contacts 16 to the exposed surface 44 of the integrated circuit chip 10. Accordingly, heat is efficiently extracted from localized high temperature regions of the integrated circuit 10 and spread out over the exposed surface 44 of the thick plated metal layer 40. The exposed surface 44 dissipates thermal energy received by the thick plated metal layer 40.

The thick plated metal layer 40 may comprise copper, copper metal, copper metal alloy, gold, or the like. Copper may be preferred because of its extremely low thermal impedance. It will be understood that the thick plated metal layer 40 may comprise other thermally conductive materials within the scope of the present invention. It will be further understood that barrier layers may be provided between adjacent metal layers using conventional integrated circuit processing techniques to prevent voiding and other adverse chemical and/or mechanical interactions. It will be further understood that the thick plated metal layer 40 may comprise a multimetal system within the scope of the present invention. The multimetal system may comprise copper and nickel, copper and palladium, or the like.

The thick plated metal layer 40 may be formed by plating metal in a mold using conventional electroplating processes. In one embodiment, the mold may comprise a cavity patterned in a thick photoresist layer formed on the passivation overcoat 32. The cavity may be of any shape and extend down to the second metal interconnects 26. Preferably, the cavity overlaps the passivation overcoat 32 around the metal interconnects by a distance great enough to compensate for misalignment of the pattern and still result in the patterned cavity efficiently overlapping the metal interconnects.

The thickness of the photoresist layer may be driven by the thickness of the desired metal plating. In one embodiment, the photoresist layer may be 12,000 angstroms thick, which will allow up to 11,000 angstroms of metal to be plated. If a greater thickness of metal plating is desired, multiple layers of photoresist may be used for the mold.

For conventional electroplating, the thick plated metal layer 40 may include a seed layer deposited prior to the electroplating process and exposed in the mold. In this embodiment, the integrated circuit chip 10 may be disposed in a copper electroplating bath. In the electroplating bath, copper will plate to the copper seed layer exposed in the mold. In one embodiment, as previously described, the thick plated metal layer 40 may be plated to a thickness of 11,000 angstroms. It will be understood that the thickness of the copper plating may be varied within the scope of the present invention.

FIG. 1B illustrates a schematic thermal circuit diagram of the integrated circuit chip 10 in accordance with one embodiment of the invention. Referring to FIG. 1B, the thermal impedance of the layers may be represented by thermal resistors where $\Theta\,14$ is a thermal impedance of the substrate, $\Theta\,16$ is a thermal impedance of the thermal contact 16, $\Theta\,24$ is a thermal impedance of the metal interconnect 24, $\Theta\,30$ is a thermal impedance of the second metal interconnect 30, and $\Theta\,40$ is a thermal impedance of the thick plated metal layer 40. As previously described, the thermal contact 16 may be disposed in a high temperature region of the integrated circuit 14. In accordance with the invention, the cumulative thermal impedance of $\Theta\,40$, $\Theta\,30$, $\Theta\,24$, and $\Theta\,16$ may be less by an order of magnitude than the thermal impedance of $\Theta\,14$ of the substrate. Accordingly, heat at the thermal contact 16, $T_1$, is transferred through the metal interconnects 24 and 30 and the thick plated metal layer 40 to the surface 44, having a temperature $T_2$, and there dissipated. It will be understood that the geometry of the vias, metal interconnects, and thick plated metal layer may be varied to control the thermal impedance of the heat spreader. Preferably, the thermal impedance of the heat spreader ensures that the integrated circuit operates within a designated temperature range.

FIG. 1C illustrates a schematic electrical circuit diagram of the integrated circuit chip 10 in accordance with one embodiment of the invention. Referring to FIG. 1C, dual-sided grounding may be employed for the integrated circuit chip 10. In this embodiment, the semiconductor layer 12 and the exposed surface 44 of the thick plated metal layer 40 may both be coupled to a ground. Accordingly, the integrated circuit chip 10 is electrically isolated.

FIG. 2 illustrates the integrated circuit chip 10 packaged in accordance with one embodiment of the invention. Referring to FIG. 2, the packaged integrated circuit chip 45 may comprise the integrated circuit chip 10 encapsulated in packaging material 46 in accordance with well known packaging techniques. The packaging material 46 may be conventional plastic used for packaging integrated circuits. Preferably, the exposed surface 44 of the thick plated metal layer 40 is at least partially exposed through the packaging material 46 to improve heat dissipation at the surface. In this embodiment, the thick plated metal layer 40 may be capped with a protective metal 48 such as nickel. The packaging material 46 may then be molded around the integrated circuit chip 10 to leave the protected metal surface exposed. External heat sinking and heat extraction methods such as fans (not shown) may be applied directly to the exposed surface to further improve heat dissipation at the surface. It will be understood that integrated circuit chip 10 may be otherwise packaged within the scope of the present invention.

Figure 3B:
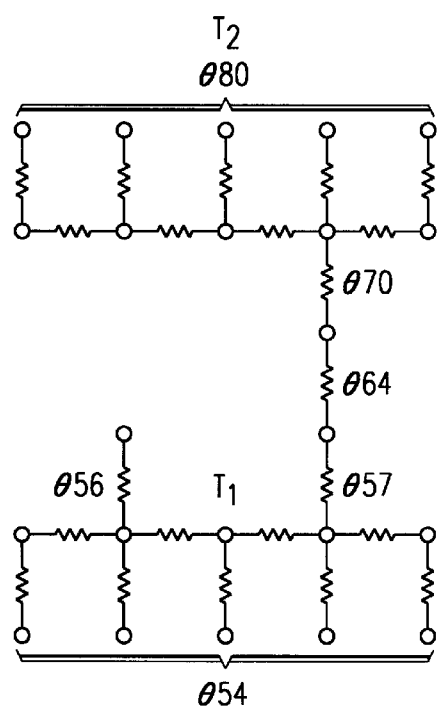
Figure 3C:
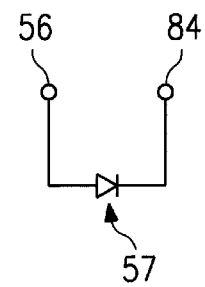

FIGS. 3A–C illustrate a cross-sectional diagram, a thermal circuit, and an electrical circuit of an integrated circuit chip 50 in accordance with another embodiment of the present invention. Referring to FIG. 3A, the integrated circuit chip 50 may comprise a semiconductor layer 52. As previously described for the semiconductor layer 12, the semiconductor layer 52 may be a substrate such as a wafer. It will be understood that the semiconductor layer 52 may also be a layer of semiconductor material formed on a substrate. For example, the semiconductor layer 52 may be an epitaxial layer grown on a wafer.

An integrated circuit 54 may be formed in the semiconductor layer 52. The integrated circuit 54 may include one or more thermal contacts 56. In one embodiment, the thermal contacts 56 may each comprise a segment of the semiconductor layer 52 and be over non-ohmic material or active circuitry.

The thermal contacts 56 may be disposed at high temperature regions of the integrated circuit 54. As previously described in connection with the thermal contacts 16, for most applications, a good range of operation is between −50 and 150 degrees Celsius. High temperature regions may be regions where generated or collected heat of the integrated circuit 54 cannot be adequately dissipated entirely through the semiconductor layer 52. High temperature regions often exist in power integrated circuits, microprocessors, large digital signal processors, large area high component count integrated circuits, and the like. High temperature regions can significantly degrade the performance of the integrated circuit 54. In one embodiment, the high temperature regions may have a temperature in excess of 150 degrees Celsius. It will be understood that the high temperature regions may have a lower temperature within the scope of the present invention.

The integrated circuit 54 may include remote circuitry at the edge of the integrated circuit chip 50. The remote circuitry may include a diode 57 forming part of a thermal sensor for a current protection circuit. The diode 57 may include an anode 58 and a cathode 59 formed using conventional integrated circuit processes. As described in more detail below, the diode 57 may monitor thermal performance for current protection features such as thermal shutdown.

A dielectric layer 60 may be formed on the integrated circuit 54 to generally isolate the integrated circuit 54 from further integrated circuit processing. As previously described in connection with the dielectric layer 20, the dielectric layer 60 may comprise silicon dioxide thermally grown on the integrated circuit 54 in accordance with conventional integrated circuit processing. It will be understood that the dielectric layer 60 may comprise other nonconductive materials such as nitrides or the like.

Vias 62 may be formed in the dielectric layer 60 to expose the thermal contacts 56 and the diode 57. The vias 62 may be formed by pattern and etching the dielectric layer 60 using conventional integrated circuit processing techniques. As described in more detail below, the vias 62 allow heat to be transferred through the dielectric layer 60. The heat transfer may be monitored by the diode 57 in accordance with known methods such as monitoring the forward conduction versus temperature ($\Delta Vbe/^\circ$ C.).

Metal interconnects 64 may be coupled to the thermal contacts 56 and the diode 57 through the vias 62 in the dielectric layer 60. In one embodiment, the metal interconnects 64 may directly contact the thermal contacts 56 and the diode 57. In this embodiment, the metal interconnects 64 may be formed by pattern and etching a metal layer deposited on the dielectric layer 60, the thermal contacts 56, and the diode 57. The pattern and etching may be in accordance with conventional integrated circuit processing.

A second dielectric layer 66 may be deposited on the dielectric layer 60 and the metal interconnects 64 to generally isolate those layers from further integrated circuit processing. As previously described in connection with the second dielectric layer 24, the second dielectric layer 66 may comprise silicon dioxide thermally grown on the dielectric layer 60 and the metal interconnects 64 in accordance with conventional integrated processing. The second dielectric layer 66 may comprise other nonconductive materials such as nitride and the like.

Vias 68 may be formed in the second dielectric layer 66 to expose the metal interconnects 64. The vias 68 may be formed by pattern and etching the second dielectric layer 66 using conventional integrated circuit processing techniques. As described in more detail below, the vias 68 allow heat to be transferred through the second dielectric layer 66.

Second metal interconnects 70 may be coupled to the metal interconnects 64 through the vias 68 in the second dielectric layer 66. As previously described in connection with the second metal interconnects 30, the second metal interconnects 70 may directly contact the underlying metal interconnects 64. In this embodiment, the second metal interconnects 70 may be formed by pattern and etching a second metal layer deposited on the second dielectric layer 66 and the metal interconnects 64. The pattern and etching may be in accordance with conventional integrated circuit processing.

As described above, the integrated circuit chip 50 of FIG. 3A may comprise two sets of metal interconnects and associated dielectric layers. The dielectric layers may act as thermal insulating barriers protecting other circuitry from heating effects. It will be understood that the integrated circuit chip 50 may comprise fewer or more sets of metal interconnects and dielectric layers within the scope of the present invention. It will be further understood that the vias may be otherwise disposed within the scope of the present invention. For example, the vias may be staggered, or offset, with respect to each other and to the contacts to provide increased thermal ballasting. In this embodiment, the contacts may be extended to contact one another through the staggered vias.

A passivation overcoat 72 may be formed on the second dielectric layer 66 and the second interconnects 70. The passivation overcoat 72 may isolate the underlying layers generally from subsequent integrated circuit processing. Additionally, the passivation overcoat 72 may act as a thermal insulating barrier protecting other circuitry from heat spreading effects of the heat spreader.

As previously described in connection with the passivation overcoat 32, the passivation overcoat 72 may comprise nitride deposited onto the second dielectric layer 66 and the second metal interconnects 70. It will be understood that the passivation overcoat 72 may comprise other nonconductive materials within the scope of the present invention. For example, the passivation overcoat 72 may comprise oxynitride.

Via 74 may be formed in the passivation overcoat 72 to expose the second metal interconnect 70 coupled to the diode 57. The via 74 may be formed by pattern and etching the passivation overcoat 72 using conventional integrated circuit processing techniques. As described in more detail below, the via 74 allows heat to be transferred through the passivation overcoat 72.

A thick plated metal layer 80 may be formed on the passivation overcoat 72 and the second metal interconnect 70. The thick plated metal layer 80 may comprise a base 82 coupled to the thermal diode contact 57 and an exposed surface 84 opposite the base 82. The surface 84 of the thick plated metal layer 80 is exposed in that it is not covered by the integrated circuit chip 50. As previously described in connection with FIG. 2, the exposed surface 84 may be capped or otherwise within the scope of the present invention.

For the embodiment of FIG. 3A, the base 82 may include a thick plated projection 86 contacting the second metal interconnect 70. In this embodiment, the thick plated metal layer 80 is thermally coupled to the diode 57 through the projection 86 and the metal interconnects 64 and 70 and to the thermal contacts 56 through the diode 57 and a segment of the semiconductor layer 52 between the thermal contacts 56 and the diode 57. As described in more detail below in connection with FIG. 3B, the thick plated projection 86 and the metal interconnects 64 and 70 form a low thermal impedance path from the diode 57 to the exposed surface 84 of the thick plated metal layer 80. As a result, heat is efficiently extracted from the thermal contacts 56 in localized high temperature regions of the integrated circuit 50 through the diode 57 and spread out over the exposed surface 84 of the thick plated metal layer 80. The exposed surface 84 dissipates thermal energy received by the thick plated metal layer 80.

The heat transfer may alter the temperature of the diode 57 which alters current at the diode 57. Accordingly, the diode 57 may be used to monitor thermal performance for circuit protection features such as thermal shutdown. Thus, if the current drops below a preset amount, the temperature of the integrated circuit chip 50 is too high and the integrated circuit 54 may be shut down.

As previously described in connection with the thick plated metal layer 40, the thick plated metal layer 80 may comprise copper, copper metal, copper metal alloy, gold, or the like. Copper may be preferred because of its extremely low thermal impedance. It will be understood that the thick plated metal layer 80 may comprise other thermally conductive materials within the scope of the present invention. It will be further understood that barrier layers may be provided between adjacent metal layers using conventional integrated circuit processing techniques to prevent voiding and other adverse chemical and/or mechanical interactions. It will be further understood that the thick plated metal layer 80 may comprise a multimetal system within the scope of the present invention. The multimetal system may comprise copper and nickel, copper and palladium, or the like.

The thick plated metal layer 80 may be formed by plating metal in a mold using a conventional electroplating process as previously described in connection with the thick plated metal layer 40 of FIG. 1A. After the thick plated metal layer 80 is formed, the integrated circuit chip 50 may be packaged as previously described in connection with packaging the integrated circuit chip 10 of FIG. 2. It will be understood that the heat spreading method and system of FIG. 1 may be combined with the method and system of FIG. 3 in a single integrated circuit.

FIG. 3B illustrates a schematic thermal circuit diagram of the integrated circuit chip 50 in accordance with one embodiment of the present invention. Referring to FIG. 3B, the thermal impedance of the layers may be represented by thermal resistors where $\Theta$ 54 is a thermal impedance of the substrate, $\Theta$ 56 is a thermal impedance of the thermal contacts 56, $\Theta$ 57 is a thermal impedance of the diode 57, $\Theta$ 64 is a thermal impedance of the metal interconnects 64, $\Theta$ 70 is a thermal impedance of the second metal interconnects 70, and $\Theta$ 80 is a thermal impedance of the thick plated metal layer 80. As previously described, the thermal contacts 56 may be in high temperature regions of the integrated circuit 54. In accordance with the invention, the cumulative thermal impedance of $\Theta$ 80, $\Theta$ 70, $\Theta$ 64, and $\Theta$ 57 may be less by an order of magnitude than the thermal impedance of the substrate. Accordingly, heat of the thermal contact 56, $T_1$, is transferred through the segment of the semiconductor layer 52 to the diode 57 and then through the metal interconnects 64 and 70 and the thick plated metal layer 80 to the surface 84, having a temperature $T_2$, and there dissipated. It will be understood that the geometry of the vias, metal interconnects, and thick plated metal layer may be varied to control the thermal impedance of the heat spreader. Preferably, the thermal impedance of the heat spreader ensures that the integrated circuit operates within a designated temperature range.

FIG. 3C illustrates an electrical circuit of the integrated circuit 50 in accordance with one embodiment of the invention. Referring to FIG. 3C, the diode 57 may be disposed between the thermal contact 56 and the exposed surface 84 of the thick plated metal layer 80. Heat transfer may alter the temperature of the diode 57 which alters current at the diode 57. Accordingly, the diode 57 may be used to monitor thermal performance for circuit protection features such as thermal shutdown. Thus, if the current drops below a preset amount, temperature of the integrated circuit chip 50 is too high and integrated circuit 54 may be shut down.

Figure 4A:
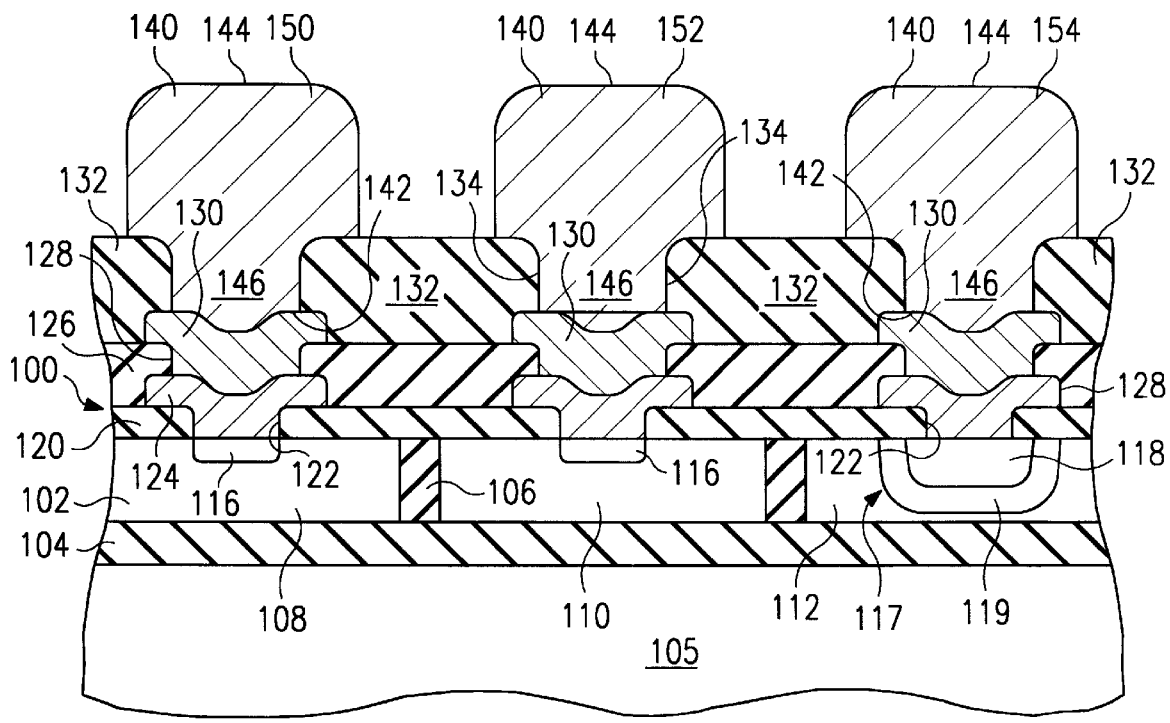
FIGS. 4A–B schematically illustrate a cross-sectional diagram and a thermal circuit of an integrated circuit chip including a heat spreader in accordance with another embodiment of the present invention.
Figure 4B:
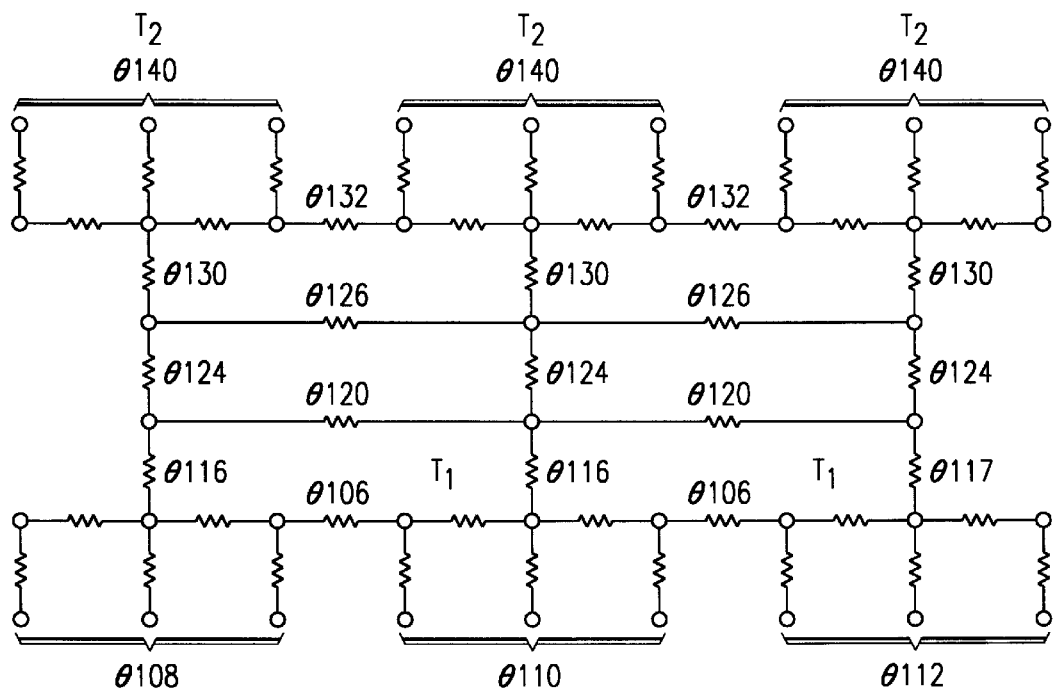

FIGS. 4A–B illustrate a cross-sectional diagram and a thermal circuit of an integrated circuit chip 100 in accordance with another embodiment of the present invention. Referring to FIG. 4A, the integrated circuit chip 100 may comprise a semiconductor layer 102 disposed on an insulation layer 104 and further laterally isolated by dielectrics (DI). In this embodiment, the semiconductor and insulation layers may form a semiconductor on insulation (SOI) system with the semiconductor layer thermally isolated from the bottom and sides by the dielectric layers. The SOI layers may be disposed on a substrate 105. In one embodiment, the semiconductor layer 102 may comprise silicon. It will be understood that the semiconductor layer 102 may comprise other semiconducting materials within the scope of the present invention.

The insulation layer 104 may comprise silicon dioxide. It will be understood that the insulation layer 104 may comprise other dielectric materials within the scope of the present invention. For example, the silicon layer 104 may comprise nitride.

Isolation trenches 106 may be formed in the semiconductor layer 102. The isolation trenches 106 may form separate devices in the semiconductor layer 102. The isolation trenches 106 may be formed by pattern and etching trenches in the semiconductor layer 102 in accordance with conventional integrated circuit processes. In one embodiment, the trenches may be filled with silicon dioxide. It will be understood that the trenches may be filled with other dielectric materials within the scope of the present invention.

For the embodiment of FIG. 4A, a power integrated circuit 108, an active integrated circuit 110, and a thermal sensor circuit 112 may be formed in the semiconductor layer 102. As previously described, the circuits 108, 110 and 112 may be isolated from one another. In this embodiment, the power integrated circuit 108 and the active integrated circuit 110 may each include one or more thermal contacts 116. In one embodiment, the thermal contacts 116 may each comprise a segment of the semiconductor layer 102 and be over non-ohmic material or active circuitry.

The thermal contacts 116 may be disposed at high temperature regions of the integrated circuits 108 and 110. High temperature regions may be regions where generated or collected heat of the integrated circuits 108 and 110 cannot be adequately dissipated through the semiconductor layer 102. High temperature regions often exist in power integrated circuits, microprocessors, large digital signal processors, large area high component count integrated circuits, and the like. This problem is compounded by the DI and SOI configuration of the integrated circuit chip 100 in which the insulation layer 104 and isolation trenches 106 greatly reduce or prevent heat transfer through the substrate 105. Accordingly, heat transfer is eliminated through the silicon substrate, which is generally a good thermal conducting medium.

High temperature regions can significantly degrade the performance of the integrated circuits 108 and 110. In one embodiment, the high temperature regions may have a temperature in excess of 150 degrees Celsius. It will be understood that the high temperature regions may have a lower temperature within the scope of the present invention.

The current protection integrated circuit 112 may include a diode 117 as part of a thermal sensor. As previously described in connection with a diode 57, the diode 117 may comprise an anode 118 and a cathode 119 formed using conventional integrated circuit processes. In FIG. 4A, the connection to the anode 118 is shown to illustrate the thermal connectivity of the embodiment. As described in more detail below, the diode 117 may monitor thermal performance for current protection features such as thermal shutdown.

A dielectric layer 120 may be formed on the integrated circuits 108, 110 and 114 to generally isolate the integrated circuits from further integrated circuit processing. As previously described in connection with dielectric layers 20 and 60, the dielectric layer 120 may comprise silicon dioxide thermally grown on the integrated circuits in accordance with conventional integrated circuit processing techniques. It will be understood that the dielectric layer 120 may comprise other nonconductive materials such as nitrides or the like.

Vias 122 may be formed in the dielectric layer 120 to expose the thermal contacts 116 and the diode 117. The vias 122 may be formed by pattern and etching the dielectric layer 120 using conventional integrated circuit processing techniques. As described in more detail below, the vias 122 allow heat to be dissipated through the dielectric layer 120.

Metal interconnects 124 may be coupled to the thermal contacts 116 and the diode 117 through the vias 122 in the dielectric layer 120. In one embodiment, the metal interconnects 124 may directly contact the thermal contacts 116 and the diode 117. In this embodiment, the metal interconnects 124 may be formed by pattern and etching a metal layer deposited on the dielectric layer 120, the thermal contacts 116 and the diode 117. The pattern and etching may be in accordance with conventional integrated circuit processing techniques.

A second dielectric layer 126 may be deposited on the dielectric layer 120 and the metal interconnects 124 to generally isolate those layers from further integrated circuit processing. As previously described in connection with the second dielectric layers 26 and 66, the second dielectric layer 126 may comprise silicon dioxide thermally grown on the dielectric layer 120 and the metal interconnects 124 in accordance with conventional integrated circuit processing techniques. The second dielectric layer 126 may comprise other nonconductive materials such as nitride and the like.

Vias 128 may be formed in the second dielectric layer 126 to expose the metal interconnects 124. The vias 128 may be formed by pattern and etching the second dielectric layer 126 using conventional integrated circuit processing techniques. As described in more detail below, the vias 128 allow heat to be transferred through the second dielectric layer 126.

Second metal interconnects 130 may be coupled to the metal interconnects 124 through the vias 128 in the second dielectric layer 126. As previously described in connection with the second metal interconnects 30 and 70, the second metal interconnects 130 may directly contact the underlying metal interconnects 124. In this embodiment, the second metal interconnects 130 may be formed by pattern and etching a second metal layer deposited on the second dielectric layer 126 and the metal interconnects 124. The pattern and etching may be in accordance with conventional integrated circuit processing techniques.

As described above, the integrated circuit chip 100 of FIG. 4A may comprise two sets of metal interconnects and associated dielectric layers. The dielectric layers may act as thermal insulating barriers protecting other circuitry from heating effects. It will be understood that the integrated circuit chip 100 may comprise fewer or more sets of metal interconnects and dielectric layers within the scope of the present invention. It will be further understood that the vias may be otherwise disposed within the scope of the present invention. For example, as previously described in connection with FIGS. 1 and 3, the vias may be staggered, or offset, with respect to each other and to the contacts to provide increased thermal ballasting.

A passivation overcoat 132 may be formed on the second dielectric layer 126 and the second interconnects 130. The passivation overcoat 132 may isolate the underlying layers generally from subsequent integrated circuit processing. Additionally, the passivation overcoat 132 may act as a thermal insulating barrier protecting other circuitry from heating effects.

As previously described in connection with the passivation overcoats 32 and 72, the passivation overcoat 132 may comprise nitride deposited onto the second dielectric layer 126 and the second metal interconnects 130. It will be understood that the passivation overcoat 132 may comprise other nonconductive materials within the scope of the present invention. For example, the passivation overcoat 132 may comprise oxy-nitride.

Vias 134 may be formed in the passivation overcoat 132 to expose the second metal interconnects 130. The vias 134 may be formed by pattern and etching the passivation overcoat 132 using conventional integrated circuit processing techniques. As described in more detail below, the vias 134 allow heat to be transferred through the passivation overcoat 132.

A thick plated metal layer 140 may be formed on the passivation overcoat 132 and the second metal interconnects 130. The thick plated metal layer 140 may comprise a base 142 coupled to the thermal contacts 116 and to the diode 117 and an exposed surface 144 opposite the base 142. The surface 144 of the thick plated metal layer 140 is exposed in that it is not covered by the integrated circuit chip 100. As previously described in connection with FIG. 2, the exposed surface 144 may be capped or otherwise covered within the scope of the present invention.

For the embodiment of FIG. 4A, the base 142 may include thick plated projections 146 contacting the second metal interconnects 130. In this embodiment, the thick plated metal layer 140 may be patterned and etched to form separate thick plated elements 150, 152 and 154. Elements 150 and 152 may be thermally coupled to the thermal contacts 116 through the projections 146. Element 154 may be thermally coupled to the diode 117 through the projection 146. As described in more detail below in connection with FIG. 4B, the thick plated projections 146 and the metal interconnects 124 and 130 form a low thermal impedance path from the thermal contacts 116 and diode 117 to the exposed surface 144 of the thick plated metal layer 140. Accordingly, heat is efficiently extracted from localized high temperature regions of the integrated circuit 100 and spread out over the exposed surface 144 of the thick plated metal layer 140. The exposed surface 144 dissipates thermal energy received by the thick plated metal layer 140.

The heat transfer may alter the temperature of the diode 117, which alters current of the diode 117. Accordingly, the diode 117 may be used to monitor thermal performance for current protection features such as thermal shutdown. Thus, if current drops below a preset limit, the temperature of the integrated circuit chip 100 is too high and the integrated circuits 108 and 110 may be shut down.

As previously described in connection with the thick plated metal layers 40 and 80, the thick plated metal layer 140 may comprise copper, copper metal, copper metal alloy, gold, or the like. Copper may be preferred because of its extremely low thermal impedance. It will be understood that the thick plated metal layer 140 may comprise other thermally conductive materials within the scope of the present invention. It will be further understood that barrier layers may be provided between adjacent metal layers in accordance with conventional integrated circuit processing techniques to prevent voiding and other adverse chemical and/or mechanical interactions. It will be further understood that the thick plated metal layer 140 may comprise a multimetal system within the scope of the present invention. The multimetal system may comprise copper and nickel, copper and palladium, or the like.

The thick plated metal layer 40 may be formed by plating metal in a mold using a conventional electroplating process as previously described in connection with the thick plated metal layer 40 of FIG. 1A. After the thick plated metal layer 140 is formed, the integrated circuit chip 100 may be packaged as previously described in connection with packaging the integrated circuit chip 10 of FIG. 2.

FIG. 4B illustrates a thermal circuit diagram of the integrated circuit chip 100 in accordance with one embodiment of the present invention. Referring to FIG. 4B, the thermal impedance of the layers may be represented by thermal resistors where Θ 106 is a thermal impedance of the isolation trenches 106, Θ 108, Θ 110 and Θ 112 are a thermal impedance of the separate integrated circuits, Θ 116 is a thermal impedance of the thermal contacts 116, Θ 117 is a thermal impedance of the diode 117, Θ 120 and Θ 126 are a thermal impedance of the dielectric layers 120 and 126, Θ 124 and Θ 130 are a thermal impedance of the metal interconnects 124 and 130, Θ 132 is a thermal impedance of the passivation overcoat 132, and Θ 140 is a thermal impedance of the thick plated elements formed from the thick plated metal layer 140. As previously described, circuits 108, 110 and 112 are thermally and electrically isolated by the insulation layer 104 and isolation trenches 106. In accordance with the invention, the cumulative thermal impedance of Θ 116 or Θ 117, Θ 124, Θ 130, and Θ 140 may be less by an order of magnitude than the thermal impedance of Θ 106 or the insulation layer 104. Accordingly, heat may be transferred from the circuits and thermal contacts through the interconnects to the thick plated elements and there dissipated at the exposed surface 144. It will be understood that the geometry of the vias, metal interconnects, and thick plated metal layer may be varied to control the thermal impedance of the heat spreader. Preferably, the thermal impedance of the heat spreader ensures that the integrated circuit operates within a designated temperature range.

The circuits 108, 110, and 112 may be further isolated from one another by the dielectric layers 120, 126, and 132. Cumulative thermal impedance of Θ 116 or Θ 117, Θ 124, Θ 130, and Θ 140 may be less by an order of magnitude than the thermal impedance of Θ 106, Θ 120, Θ 126, or Θ 132. Accordingly, the circuits are isolated from one another by dielectric capacitance.

Although the present invention has been described in several embodiments, changes, variations, alterations, transformations, combinations, and modifications, it may be suggested to one skilled in the art, and it is intended that the present invention encompass such changes, variations, alterations, transformations, and modifications as fall within the scope of the appended claims.

What is claimed is:

1. A packaged integrated circuit chip, comprising: an integrated circuit chip, comprising:

an integrated circuit formed in a semiconductor layer;

a thermal contact formed in the semiconductor layer at a high temperature region of the integrated circuit;

a metal layer formed over the integrated circuit, comprising:

a base coupled to the thermal contact to receive thermal energy of the high temperature region;

an exposed surface opposite the base to dissipate thermal energy received by the metal layer;

packaging material disposed about the integrated circuit chip; and the exposed surface of the metal layer at least partially exposed through the packaging material.

2. The integrated circuit chip of claim 1, further comprising:

a metal interconnect disposed between the base of the thick plated metal layer and the thermal contact; and the metal interconnect coupled to the thermal contact of the integrated circuit and to the base of the thick plated metal layer.

3. The integrated circuit chip of claim 1, the thick plated metal layer further comprising copper.

4. The integrated circuit chip of claim 1, the thick plated metal layer further comprising a copper metal alloy.

5. The integrated circuit chip of claim 1, further comprising a protective metal cap coupled to the exposed surface of the thick plated metal layer.

6. The integrated circuit chip of claim 5, the protective metal cap further comprising nickel.

7. The integrated circuit chip of claim 6, further comprising an insulation layer, said semiconductor layer being disposed on said insulation layer.

8. The integrated circuit chip of claim 6, further comprising a thermal sensor formed in the semiconductor layer, the metal layer coupled to the thermal sensor.

9. The integrated circuit chip of claim 8, in which the thermal sensor comprises a diode.

10. The integrated circuit chip of claim 1, in which the metal layer is a thick plated metal layer.

* * * * *